United States Patent [19]

Taylor et al.

[11] 4,341,820

[45] * Jul. 27, 1982

[54] COMPOSITION OF MATTER

[75] Inventors: Lynn J. Taylor, Haslett, Mich.; John D. Grier, Toledo, Ohio

[73] Assignee: Owens-Illinois, Inc., Toledo, Ohio

[*] Notice: The portion of the term of this patent subsequent to Dec. 18, 1990, has been disclaimed.

[21] Appl. No.: 175,464

[22] Filed: Aug. 5, 1980

Related U.S. Application Data

[60] Division of Ser. No. 731,956, Oct. 13, 1976, abandoned, which is a continuation of Ser. No. 302,062, Oct. 30, 1972, abandoned, which is a division of Ser. No. 174,197, Aug. 23, 1971, Pat. No. 4,014,845.

[51] Int. Cl.³ .............................................. B05D 3/02
[52] U.S. Cl. .................... 427/226; 427/229; 427/376.1; 427/376.2; 427/376.1
[58] Field of Search ............... 427/376.1, 376.2, 226, 427/229; 252/511; 260/31.8 R, 42.52; 526/11.1

[56] References Cited

U.S. PATENT DOCUMENTS

| | | | |
|---|---|---|---|
| 3,663,276 | 5/1972 | Allington et al. | 427/226 |
| 3,779,807 | 12/1973 | Taylor et al. | 427/226 |
| 3,784,407 | 1/1974 | Shio et al. | 427/226 |
| 3,816,162 | 6/1974 | Taylor | 427/226 |
| 3,975,201 | 8/1976 | Greenstein | 427/226 |
| 3,982,941 | 9/1976 | Inskip | 427/226 |
| 4,025,669 | 5/1977 | Greenstein | 427/226 |

*Primary Examiner*—Norman Morgenstern
*Assistant Examiner*—Janyce A. Bell
*Attorney, Agent, or Firm*—Charles S. Lynch; M. E. Click; D. H. Wilson

[57] ABSTRACT

There is disclosed a fugitive vehicle system comprising at least two organic components, at least one component being a solid polymeric material capable of pyrolyzing in a non-oxygen containing environment and at least one other component being a solvent for the solid polymeric material, the solvent being capable of removal at a temperature below the pyrolyzing temperature of the polymeric material. This fugitive vehicle system is especially suitable in microelectronic applications.

12 Claims, No Drawings

COMPOSITION OF MATTER

This is a divisional application of copending application Ser. No. 731,956 filed Oct. 13, 1976 now abandoned which is a continuation application of Ser. No. 302,062 filed Oct. 30, 1972, now abandoned, which is a divisional application of Ser. No. 174,197 filed Aug. 23, 1971, now U.S. Pat. No. 4,014,845.

This invention relates to a novel fugitive vehicle system comprising a solid polymeric material and a solvent.

Fugitive vehicle systems are generally well known in the prior art, as evidenced for example by U.S. Pat. No. 2,312,229 issued to Anderson which discloses a process for coating vitreous surfaces with fluorescent materials by suspending fluorescent powder in a binder comprising a solution of polystyrene in a solvent. Similar systems are disclosed by U.S. Pat. No. 2,328,101 issued to Rosenblatt and U.S. Pat. No. 3,475,161 issued to Ramirez.

Fugitive vehicle systems have been especially useful in the coating art. Thus, particulate coating materials are commonly applied to substrates by a wet process, that is, while dispersed in a system consisting of a binder and a solvent. Such a process typically requires mixing of a binder, or solvent, and an inorganic material to form a paste or slurry which is applied to the surface to be coated.

The wet coating technique is commonly used to seal glass or ceramic parts, as in the formation of cathode ray tubes wherein the face plate is attached to the funnel. In this technique, a paste having solder glass distributed throughout a binder-solvent system is applied to the edges of one part in the form of a ribbon. The remaining part is then placed in contact with the paste and the assemblage is heated to evaporate the solvent, burn out the binder, and fuse the solder glass. While this technique is extensively used, quality control is difficult and expensive because of carbonaceous or like residue which may not be removed by evaporation or burning during the heating step. Likewise, during the evaporation of the solvent, there may be changes in the viscosity and/or thixotropic character of the system which may result in such deleterious effects as orange peel formation, fish eye formation, etc., especially on flat surfaces.

In an effort to overcome the difficulties inherent in applying a coating or sealant to substrates via a binder-solvent system, the prior art has used dry coating compositions containing polymeric binders and having the particulate coating material uniformly distributed therethrough. These compositions are formed into films which are applied to the substrate to be coated and then heated to burn out the binder and form a coating of the inorganic material usually in fused or sintered form. However, the presence of carbonaceous residue may still present a problem in such a system.

In copending U.S. patent application Ser. No. 825,410, filed May 16, 1969 by Fred E. Mansur and copending U.S. patent application Ser. No. 806,320, filed Mar. 11, 1969 by Don N. Gray and John D. Grier, both applications being assigned to the same assignee as the instant application, there are disclosed novel wet coating systems comprising liquid poly (alpha substituted) styrene dispersed in a cyclic isoprenoid solvent.

In accordance with the practice of this invention, there is provided a fugitive vehicle system comprising at least two organic components, at least one component being a solid polymeric material capable of pyrolyzing in a non-oxygen containing environment and at least one other component being a solvent for the polymeric material, the solvent being capable of removal at a temperature below the pyrolyzing temperature of the polymeric material.

As used herein, "pyrolyzing" is defined as the decomposition of the polymeric material to gaseous products without passing through a broad liquid range and without leaving a noticeable carbonaceous or other like residue which would interfere with the intended function of the system.

The polymeric material is one which will pyrolyze, as distinguished from vaporization, when appropriate energy is applied thereto at some predetermined energy level about the level of energy required to remove the solvent.

Energy level, as used herein, is intended to include any reasonably measurable molecular energy state which is related to the pyrolyzing of the polymer and/or removal of the solvent. The most obvious energy level is temperature, which has been defined as the average molecular kinetic energy. Hereinafter, temperature level will be used as a synonym for energy level. However, the invention is not limited to temperature level alone, but is intended to include any molecular energy level or state which can be obtained by any appropriate energy from any source or means, such as chemical, electrical, thermal, mechanical, sonic, etc. Likewise, the energy can be transmitted in any suitable form such as by electromagnetic radiation, visible or invisible, e.g., infra-red, ultraviolet, x-rays, gamma rays, and beta rays.

The polymeric material, when solvent-free, is solid under the conditions of handling, e.g., typically room or factory temperatures ranging from about 40° F. to about 120° F. However, more extreme temperatures are contemplated if the conditions of handling so warrant.

The use of a solid polymeric material is advantageous in that the material behaves as a binder during the interval between the evaporation of the solvent and the pyrolytic removal of the polymeric material. This may be especially important when the fugitive vehicle system is being loaded with other materials, e.g., for coating a substrate.

The polymeric material is typically selected from one or more pyrolyzable solid polymers or copolymers such as polyethers including poly (tetrahydrofuran), poly (1,3-dioxolane), and poly (alkylene oxides), especially poly (ethylene oxide) or poly (propylene oxide); poly (alkyl methacrylates) including those where the alkyl contains one to six carbons, especially poly (methyl methacrylate), poly (ethyl methacrylate), and poly (n-butyl methacrylate); methacrylate copolymers including methyl methacrylate/n-butyl methacrylate copolymers, methyl methacrylate/alpha methyl styrene copolymers, n-butyl methacrylate/alpha methyl styrene copolymers, methyl methacrylate/styrene copolymers, methyl methacrylate/dimethyl itaconate copolymers; and other selected polymers and copolymers including polyisobutylene; poly (trimethylene carbonate); poly (beta-propiolactone); poly (deltavalerolacetone); poly (ethylene carbonate); poly (propylene carbonate); poly (ethylene oxalate); vinyl toluene/alpha-methylstyrene copolymers; styrene/alpha-methylstyrene copolymers; and olefin-sulfur dioxide copolymers.

In one specific embodiment hereof, there is used a polymeric material having oxygen atoms selectively incorporated in its molecular chain, as, for example, peroxy linkages in the chain. Such a pyrolyzable polymer is disclosed in U.S. Pat. No. 3,632,365 to Dr. Don N. Gray and assigned to the same assignee as that of the instant patent application. Typically there is used a copolymer, terpolymer, or quadpolymer of oxygen and at least one monomer of alkyl methacrylate with the alkyl containing one to six carbon atoms, e.g., methyl to hexyl, preferably butyl. Copolymers of oxygen with other vinyl monomers may also be utilized.

The common characteristics of the selected polymeric material is that it must be solid at ambient temperature and pyrolyzable at an elevated temperature, e.g., about 250° C. to about 450° C.

This pyrolysis mechanism of removal of the composition of the invention is of great advantage in non-oxygen-containing atmospheres, but the compositions may also be used in an oxygen-containing atmosphere. This characteristic permits the use of a continuum of atmospheric pressures downward from somewhat less than 14.7 lbs. per sq. in. absolute to vacua approaching the micron range. Likewise, inert environments such as nitrogen, argon, etc. may be used.

The organic solvent component of the vehicle system comprises one or more organic solvents having a boiling temperature below the pyrolysis temperature of the polymer, e.g., within a range of about 100° C. to about 400° C., preferably about 200° C. to about 350° C. The use of high boiling solvents makes the fugitive system effectively non-drying at room temperature.

Examples of suitable solvents include polychlorinated polyphenols (Arochlor 1221 or 1232, manufactured by Monsanto Chemical Co.,); dialkyl phthalates, such as dimethyl, diethyl, or di-n-butyl phthalate; di-n-butyl succinate; dimethyl sebacate; dibenzyl ether; butyl benzoate; acetyl triethyl citrate; glyceryl triacetate; beta-ethoxy ethyl benzoate; isoamyl benzoate; benzyl benzoate; isobutyl salicylate; isoamyl salicylate; benzyl salicylate; ethyl laurate; butyl oleate; ethyl myristate; butyl benzyl phthalate; dimethyl suberate; diethyl sebacate; diethyl azelate; di-n-butyl adipate; diisobutyl adipate; dibutyl sebacate; dibutyl tartrate; glyceryl tributyrate; diethyl isophthalate; butyl palmitate; dodecylbenzene; tetradecylbenzene; pentaethylbenzene; diphenylmethane; 1,1-diphenylethane; 1-chloronaphthalene; 1-bromonaphthalene; dimethylnaphthalene (various isomers, and mixtures thereof); 1-methoxy naphthalene; n-alkanes containing 14 to 20 carbon atoms and mixtures thereof; diphenyl ether; bis(alpha-methylbenzyl) ether; tetraethylene glycol dimethyl ether; 2-benzyloxyethanol; phenyl n-hexyl carbinol; triethylene glycol; 1,4-pentanediol; hexanophenone; 1-naphthyl methyl ketone; p-n-pentylphenol; N-cyclohexyl-2-pyrrolidone; glutaronitrile; and p-methoxyphenylacetonitrile. The selected solvent may also be thermally degradable to volatile products, e.g., within the boiling range temperatures indicated above.

Among the organic solvents, it is also possible to select some which act as plasticizers for the polymer, thereby obtaining a beneficial solvating effect.

The relative proportions of solvent (or plasticizer) and polymeric material will depend upon the respective types of materials. However, the weight ratio of solvent to polymeric material will generally be within a range of about 100:1 to about 1:100, preferably about 10:1 to about 1:10.

The fugitive vehicle composition of this invention has numerous advantages and utility depending upon what additional ingredients, if any, are incorporated therein. Such additional ingredients include not by way of limitation both liquid and solid substances such as pigments, fillers, resins, ceramics, glasses, etc.

The composition is especially advantageous in the formation of thick-film systems designed for processing in non-oxidizing atmospheres, e.g., as in the preparation of microelectronic circuits, devices, and components thereof. Another particular use comprises a glazing process wherein a powdered glass is supplied to a substrate and subsequently melted to form a continuous film, e.g., such as a dielectric film in a gas discharge display/memory device.

We claim:

1. A process for coating a substrate with a layer of inorganic material which comprises
   (a) applying to the substrate a composition of matter containing particulate inorganic material dispersed in a fugitive vehicle system, said particulate material having a fusion temperature and said fugitive vehicle system comprising at least two organic components, at least one component being a polymeric material which is a solid at ambient temperature, has a pyrolysis temperature below said fusion temperature of said particulate material and following pyrolysis in a non-oxygen containing environment, leaves no carbonaceous residue having a deleterious affect on said particulate material, and at least one other component being a solvent for dissolving said polymeric material, said solvent being a liquid at ambient temperature and having a volatilization or decomposition temperature range of about 200° C. to about 350° C. but below the pyrolysis temperature of said polymeric material,
   (b) heating said composition containing said fugitive vehicle system and said particulate inorganic material to a temperature sufficient to volatilize said solvent to form a coating of said polymeric material containing said particulate inorganic material, and
   (c) further heating said resultant coating to higher temperatures sufficient to pyrolyze said polymeric material and fuse said particulate inorganic material to said substrate.

2. The process of claim 1 wherein the polymeric material has a pyrolysis temperature of about 250° C. to about 450° C.

3. The process of claim 2 wherein the inorganic material comprises glass.

4. The process of claim 1 wherein the polymeric material is at least one pyrolyzable solid polymer or copolymer selected from polyethers, poly (alkyl methacrylates), methacrylate copolymers, polyisobutylene, poly (trimethylene carbonate), poly (beta-propiolactone), poly (delta-valerolactone), poly (ethylene carbonate), poly (propylene carbonate), and poly (ethylene oxalate).

5. The process of claim 4 wherein the polymeric material is a poly (alkyl methacrylate) with the alkyl containing one to six atoms.

6. The process of claim 2 wherein the polymeric material has oxygen atoms selectively incorporated in its molecular chain.

7. The process of claim 2 wherein the polymeric material is a copolymer, terpolymer, or quadpolymer of oxygen and at least one monomer of alkyl methacrylate with the alkyl containing one to six carbon atoms.

8. The process of claim 7 wherein the alkyl is n-butyl.
9. The process of claim 7 wherein the alkyl is methyl.
10. The process of claim 2 wherein the weight ratio of solvent to polymeric material ranges from about 100:1 to about 1:100.
11. The process of claim 4 wherein the solvent is selected from the group consisting of polychlorinated polyphenyls, dialkyl phthalates, di-n-butyl succinate, dimethyl sebacate, dibenzyl ether, butyl benzoate, acetyl triethyl citrate, glyceryl triacetate, beta-ethoxy ethyl benzoate, isoamyl benzoate, benzyl benzoate, isobutyl salicylate, isoamyl salicylate, benzyl salicylate, ethyl laurate, butyl oleate, ethyl myristate, butyl benzyl phthalate, dimethyl suberate, diethyl sebacate, diethyl azelate, di-n-butyl adipate, diisobutyl adipate, dibutyl sebacate, dibutyl tartrate, glyceryl tributyrate, diethyl isophthalate, butyl palmitate, docecylbenzene, tetradecylbenzene pentaethylbenzene, diphenylmethane, 1,1-diphenylethane, 1-chloronaphthalene, 1-bromonaphthalene, dimethyl-naphthalene, 1-methoxy naphthalene, n-alkanes containing 14 to 20 carbon atoms, diphenyl ether, bis (alpha-methylbenzyl) ether, tetraethylene glycol dimethyl ether, 2-benzyloxyethanol, phenyl n-hexyl carbinol, triethylene glycol, 1,4-pentanediol, hexanophenone, 1-naphthyl methyl ketone, p-n-pentylphenol, N-cyclohexyl-2-pyrrolidone, glutaronitrile, and p-methoxyphenylacetonitrile.

12. The process of claim 11 wherein said dialkyl phthalates are selected from the group consisting of dimethyl, di-n-butyl phthalate and diethyl di-n-butyl phthalate.

* * * * *

UNITED STATES PATENT AND TRADEMARK OFFICE
CERTIFICATE OF CORRECTION

PATENT NO. : 4,341,820

DATED : July 27, 1982

INVENTOR(S) : L. J. Taylor and J. D. Grier

It is certified that error appears in the above–identified patent and that said Letters Patent are hereby corrected as shown below:

Col. 1, line 27, "or" should be --a--

Col. 4, line 12, "supplied" should be --applied--

Signed and Sealed this

Twelfth Day of October 1982

[SEAL]

Attest:

GERALD J. MOSSINGHOFF

Attesting Officer — Commissioner of Patents and Trademarks